United States Patent [19]
Ohta

[11] Patent Number: 6,081,452
[45] Date of Patent: Jun. 27, 2000

[54] SEMICONDUCTOR STORAGE DEVICE CAPABLE OF ACCURATELY COLLECTIVELY EXECUTING ERASE VERIFY OPERATION ON ALL MEMORY CELLS

[75] Inventor: Yoshiji Ohta, Osaka, Japan

[73] Assignee: Sharp Kabushiki Kaisha, Osaka, Japan

[21] Appl. No.: 09/025,996

[22] Filed: Feb. 19, 1998

[30] Foreign Application Priority Data

Feb. 28, 1997 [JP] Japan ..................... 9-045374

[51] Int. Cl.⁷ ..................................... G11C 16/06
[52] U.S. Cl. ..................... 365/185.22; 365/185.25; 365/185.21
[58] Field of Search ................. 365/185.25, 185.22, 365/185.21

[56] References Cited

U.S. PATENT DOCUMENTS

| | | | |
|---|---|---|---|
| 5,097,446 | 3/1992 | Shoji et al. | 365/185.21 |
| 5,490,107 | 2/1996 | Akaogi et al. | 365/185.22 |
| 5,541,879 | 7/1996 | Suh et al. | 365/185.22 |
| 5,590,074 | 12/1996 | Akaogi et al. | 365/185.22 |
| 5,748,531 | 5/1998 | Choi | 365/185.25 |
| 5,831,905 | 11/1998 | Hirano | 365/185.22 |
| 5,844,842 | 12/1998 | Seki et al. | 365/185.24 |

FOREIGN PATENT DOCUMENTS

| | | |
|---|---|---|
| 04003395 | 1/1992 | Japan . |
| 07111091 | 4/1995 | Japan . |
| 08227590 | 9/1996 | Japan . |

*Primary Examiner*—David Nelms
*Assistant Examiner*—Van Thu Nguyen
*Attorney, Agent, or Firm*—Morrison & Foerster LLP

[57] ABSTRACT

A verify operation is accurately collectively executed on all memory cells. In verify operation, first, the levels of a pre-charge signal φpre and a collective erase verify mode selection signal φaev are made to be "L", so that a common bit line 5 and all bit lines BL0 through BLm are individually charged with a pre-charge voltage Vpre. Thereafter, the level of the collective erase verify mode selection signal φaev is made to be "H" to connect the common bit line 5 to all the bit lines BL0 through BLm and a sense amplifier 8, and all word lines WL0 through WLn are selected by a row decoder circuit 2. Then, there is watched an event that the common bit line 5 is discharged and an output signal OUT of the sense amplifier 8 becomes "L" due to the existence of a non-erased memory cell in a memory cell array 1. In this case, the discharge of the common bit line 5 occurs when at least one non-erased memory cell transistor MT exists in the memory cell array 1, and therefore, the verify operation can be accurately collectively executed on all the memory cells.

4 Claims, 12 Drawing Sheets

SEMICONDUCTOR STORAGE DEVICE CAPABLE OF ACCURATELY COLLECTIVELY EXECUTING ERASE VERIFY OPERATION ON ALL MEMORY CELLS

BACKGROUND OF THE INVENTION

The present invention relates to semiconductor storage devices, and in particular, to a semiconductor storage device having a nonvolatile memory for executing a collective erase verify operation.

Nonvolatile semiconductor storage devices have been remarkably developed in recent years, and in particular, the rewriting times of flash memories have been substantially shortened. However, about a half of the rewriting time is consumed by the verify operation of checking whether or not the data in a memory cell has been rewritten in conformity to an expected value, and therefore, it is indispensable to provide a device for reducing this verify operation time.

In view of the above, there has been an attempt at reducing the verify operation time by providing sense amplifiers corresponding in number to memory cells to be subjected to a simultaneous write operation and simultaneously verifying the memory cells subjected to the simultaneous write operation in the verify operation.

According to the above verify method, in regard to the write operation of the above rewrite operation, the number of memory cells to be subjected to the simultaneous write operation correspond to about 1 bit to 4 kbits. Since the data to be written into individual memory cells differ from one another, it can be considered efficient to simultaneously verify the memory cells of about 1 bit to 4 kbits subjected to the simultaneous write operation.

However, in regard to the erase operation of the rewrite operation, memory cells of not less than 2 kbits to 512 kbits are collectively erased and all the memory cells are rewritten into identical data ("0" or "1"). Therefore, the conventional verify operation, in which memory cells of about 1 bit to 4 kbits are simultaneously verified by sense amplifiers similar to the write operation, is hard to be considered efficient.

In view of the above, a variety of erase verify methods as follows have been proposed. It is to be noted that the term "verify" mentioned hereinafter means the erase verify.

The discrimination between 0 and 1 of information held in the memory cells of the nonvolatile semiconductor storage device is normally executed by detecting whether a threshold voltage of the memory cell transistor is high or low. However, the verify methods described below are the verify methods of a memory cell array in which the low threshold voltage state is defined as an erased state. The verify operation in this case is required to collectively check the event that the threshold voltages of all the memory cell transistors have been reduced (i.e., the event that a current flows through all the memory cell transistors when a voltage intermediate between the high and low threshold voltages is applied to the gates of all the memory cell transistors).

(1) The erase operation is completed at the point of time when the event that a current has flowed through the memory cell transistor exhibiting the minimum threshold voltage among all the memory cell transistors is detected (Japanese Patent Laid-Open Publication No. HEI 4-3395.)

(2) The n(n: integer) memory cells connected to one word line are simultaneously verified by the same number of decision circuits (Japanese Patent Laid-Open Publication No. HEI 8-227590). This verify method has the same concept as that of the line test proposed in connection with the prior art DRAM (Dynamic Random Access Memory) and the like.

(3) In a virtual ground type memory cell array, when a current flows by applying a voltage in series across the sources and the drains of a number of memory cell transistors connected to one word line, it is decided that all the memory cells connected to the word line have been erased (Japanese Patent Laid-Open Publication No. HEI 7-111901).

However, the aforementioned prior art nonvolatile semiconductor storage device verify methods have the problems as follows.

That is, as stated before, the above verify methods are executed by collectively checking whether or not a current flows through all the memory cell transistors when the voltage intermediate between the high and low threshold voltages is applied to the gates of all the memory cell transistors.

However, the operation of collectively verifying the event that a current flows through all the memory cells is required to detect one memory cell through which no current flows among a number of memory cells through which currents are flowing, and this is very hard to be achieved physically.

For example, according to the verify method listed in the item (1), the erase operation is executed by reducing the threshold voltages of the memory cell transistors from a programmed state D1 to an erased state D2 as indicated by the memory cell transistor threshold voltage distribution shown in FIG. 13. Then, the completion of the verify operation is determined by detecting the event that the threshold voltage A of the memory cell which is most likely to be erased has lowered from a word line selection voltage C in the verify operation. Accordingly, there still remains the possibility that the threshold voltage B of the memory cell which is least likely to be erased is greater than the selection voltage C and is kept intact in the programmed state, and this poses the problem that the erasing of all the memory cells has been verified.

According to the verify method listed in the item (2), the n memory cells connected to one word line are simultaneously verified by the same number of decision circuits, and therefore, the problem of the verify method (1) can be solved. However, the method has the problem of an increase in area for the requirement of n decision circuits identical in number to the n memory cells to be verified collectively and the problem of an increase in time of the verify operation for the requirement of the verify operation times in a cycle identical to the number m(m: integer) of the word lines.

According to the verify method listed in the item (3), the problem of the verify method (1) can be solved. However, if the ON-state resistance of the memory cell transistor and the substrate effect are taken into consideration, the method has the problem that the current is too infinitesimal and the problem that not so much memory cell transistors can be connected and simultaneously verified due to an increase in threshold value.

SUMMARY OF THE INVENTION

The object of the present invention is therefore to provide a semiconductor storage device having a nonvolatile memory capable of accurately collectively executing the erase verify operation on all the memory cells.

In order to achieve the aforementioned object, the present invention provides a semiconductor storage device comprising:

a memory cell array having nonvolatile memory cells in which control gates and drains of a plurality of memory cell transistors each having a floating gate are connected to word lines and bit lines arranged in a matrix form;

a row decoder circuit which selects between the word lines of the memory cell array;

a column decoder circuit which selects between the bit lines of the memory cell array;

a sense amplifier which outputs a detection signal upon detecting an event that an inputted voltage or current has exceeded a reference value;

a common bit line connected to an input terminal of the sense amplifier;

a switching circuit which receives a verify selection signal and connects the bit lines of the memory cell array to the common bit line according to the verify selection signal; and a pre-charging circuit which pre-charges the common bit line with a specified voltage.

In the above construction, the erasing of the memory cell array is defined as being executed by injecting electrons into the floating gates of all the memory cell transistors. Then, after pre-charging the common bit line with the specified voltage, all the bit lines of the memory cell array are connected to the common bit line in response to the verify selection signal. Then, after selecting all the word lines of the memory cell array, a collective erase verify operation is executed by watching the detection signal from the sense amplifier.

In this case, when at least one non-erased memory cell exists in the memory cell array, the pre-charged common bit line is discharged through the non-erased memory cell transistor, and therefore, the erase verify operation is accurately collectively executed on all the memory cells based on the detection signal from the sense amplifier.

The present invention provides a collective erase verify method for collectively verifying an event that electrons are injected into the floating gates of all the memory cell transistors to erase information held in the memory cell array of the semiconductor storage device, comprising the steps of:

pre-charging the common bit line with a specified voltage by the pre-charging circuit;

connecting the bit lines of the memory cell array to the common bit line by means of the switching circuit according to the verify selection signal;

selecting all the word lines of the memory cell array by means of the row decoder circuit; and executing a collective erase verify operation upon detecting an event that the pre-charged common bit line has been discharged via the non-erased memory cell transistor on the basis of a detection signal from the sense amplifier.

According to the above method, when at least one non-erased memory cell exists in the memory cell array, the pre-charged common bit line is discharged, and therefore, the erase verify operation is accurately collectively executed on all the memory cells based on the detection signal from the sense amplifier.

The present invention provides a semiconductor storage device comprising:

a memory cell array having nonvolatile memory cells in which control gates and drains of a plurality of memory cell transistors each having a floating gate are connected to word lines and bit lines arranged in a matrix form;

a row decoder circuit which selects between the word lines of the memory cell array according to a row address signal;

a column decoder circuit which selects between the bit lines of the memory cell array according to a column address signal and includes a switching element for connecting the selected bit line to a data line;

a sense amplifier which outputs a detection signal upon detecting an event that the data line is connected to an input terminal of the sense amplifier and a voltage or current inputted from the data line has exceeded a reference value;

a switching circuit which receives a verify selection signal and turns on the switching element according to the verify selection signal regardless of the column address signal, thereby connecting the bit lines of the memory cell array to the data line; and a pre-charging circuit which pre-charges the data line with a specified voltage.

In the above construction, the erasing of the memory cell array is defined as being executed by injecting electrons into the floating gates of all the memory cell transistors. Then, after pre-charging the data line with the specified voltage, all the bit lines of the memory cell array are connected to the data line by turning on the switching elements of the column decoder circuit in response to the verify selection signal regardless of the column address signal. Then, after selecting all the word lines of the memory cell array, the collective erase verify operation is executed by watching the detection signal from the sense amplifier.

In this case, when at least one non-erased memory cell exists in the memory cell array, the pre-charged data line is discharged through the non-erased memory cell transistor, and therefore, the erase verify operation is accurately collectively executed on all the memory cells based on the detection signal from the sense amplifier.

The present invention provides a collective erase verify method for collectively verifying an event that electrons are injected into the floating gates of all the memory cell transistors to erase information held in the memory cell array of the semiconductor storage device, comprising the steps of:

pre-charging the data line with a specified voltage by means of the pre-charging circuit;

turning on the switching elements of the column decoder circuit by means of the switching circuit according to the verify selection signal regardless of the column address signal, thereby connecting the bit lines of the memory cell array to the data line;

selecting all the word lines of the memory cell array by means of the row decoder circuit according to the row address signal; and executing a collective erase verify operation upon detecting an event that the pre-charged data line has been discharged via the non-erased memory cell transistor on the basis of a detection signal from the sense amplifier.

According to the above method, when at least one non-erased memory cell exists in the memory cell array, the pre-charged data line is discharged, and therefore, the erase verify operation is accurately collectively executed on all the memory cells based on the detection signal from the sense amplifier.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below on the basis of the preferred embodiments thereof with reference to the accompanying drawings.

The present invention is related to a semiconductor storage device for verifying an erased state in which threshold voltages of all memory cell transistors of a memory cell array are higher than a specified value and no current flows.

First Embodiment

Figure 1:
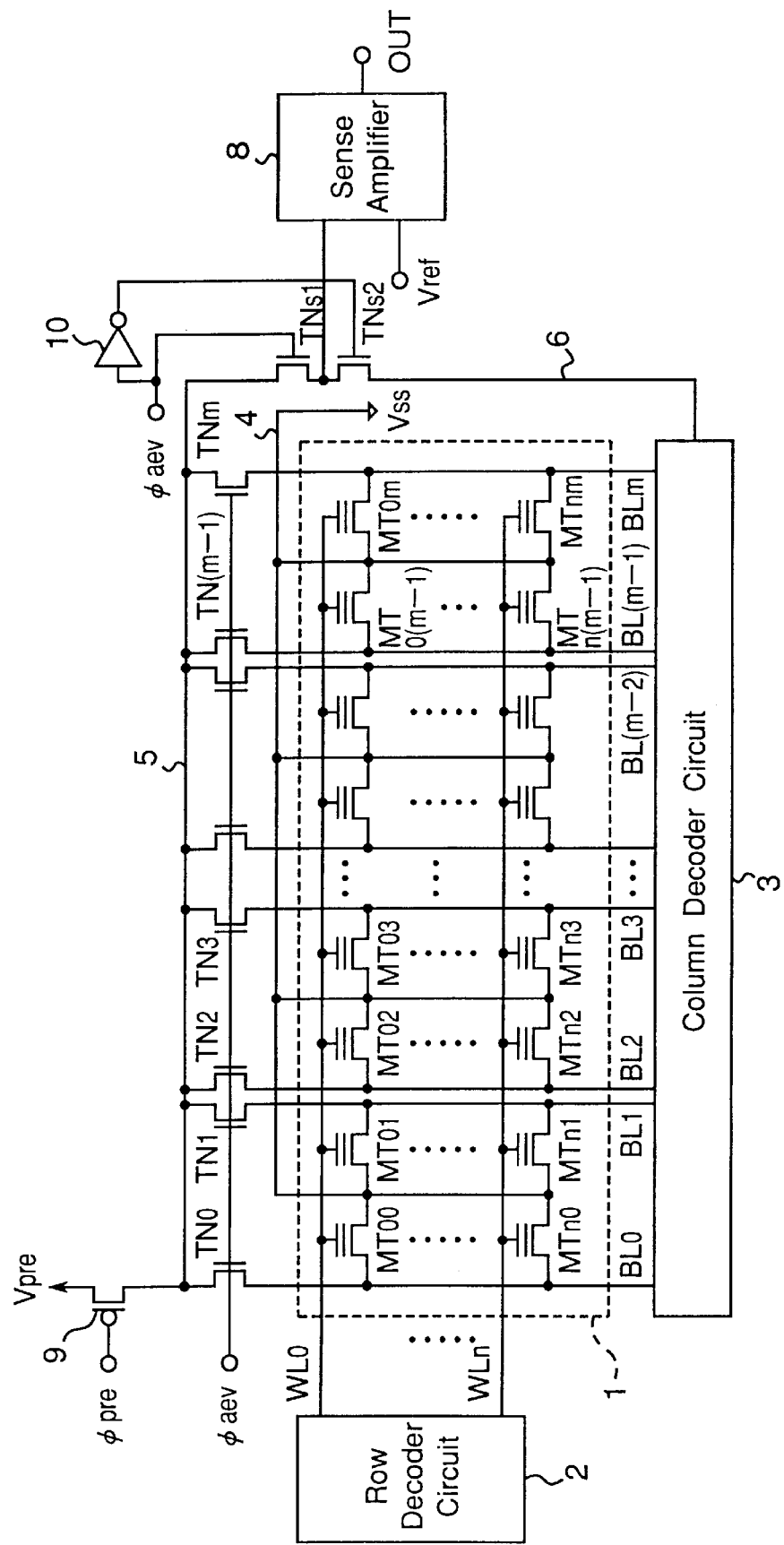
FIG. 1 is a schematic diagram of a semiconductor storage device of the present invention.

FIG. 1 is a schematic diagram of a semiconductor storage device according to a first embodiment.

A reference numeral 1 denotes a memory cell array in which (m×n) memory cell transistors (field-effect transistors each having a floating gate) MT are arranged in a matrix form. The control gates of memory cell transistors MT00, ..., MT0m arranged in the first row are connected to a word line WL0 connected to the first output terminal of a row decoder circuit 2. Similarly, the control gates of memory cell transistors MTn0, ..., MTnm of the last row are connected to a word line WLn connected to the last output terminal of the row decoder circuit 2.

Further, the drains of the memory cell transistors MT00, ..., MTn0 arranged in the first column among the memory cell transistors MT constituting the memory cell array 1 are connected to a bit line BL0 connected to the first output terminal of a column decoder circuit 3. Similarly, the drains of memory cell transistors MT0m, ..., MTnm of the last column are connected to a bit line BLm connected to the last output terminal of the column decoder circuit 3.

The bit lines BL0 through BLm are connected to the input terminal of a sense amplifier 8 via corresponding transistors TN0 through TNm, a common bit line 5 and a transistor TNs1. The input terminal of the sense amplifier 8 is connected to a data line 6 via a transistor TNs2. It is to be noted that this data line 6 is connected to the bit line BL selected by the column decoder circuit 3.

Further, the sources of the memory cell transistors MT00, ..., MTn0 of the first column and the sources of memory cell transistors MT01, ..., MTn1 of the second column are together connected to the ground Vss by way of a Vss line 4. Similarly, the sources of memory cell transistors MT0(m−1), ..., MTn(m−1) of the m-th column and the sources of memory cell transistors MT0m, ..., MTnm of the (m−1)th column are together connected to the ground Vss by way of the Vss line 4.

The common bit line 5 is connected to a pre-charge power source Vpre via a transistor 9 of which a gate receives an input of a pre-charge signal φpre. The gate of the transistor TNs1 receives a collective erase verify mode selection signal φaev, while the gate of the transistor TNs2 receives the collective erase verify mode selection signal φaev via an inverter 10. The gates of the transistors TN0 through TNm receive the collective erase verify mode selection signal φaev in common.

The sense amplifier 8 watches whether or not the potential at the common bit line 5 connected to the input terminal has reduced from the pre-charge voltage Vpre beyond a reference voltage Vref during the verify operation time. Then, upon detecting a reduction in voltage, the sense amplifier 8 changes the level of its output signal OUT from "H" to "L".

Generally in a nonvolatile memory, the information held in the memory cell is discriminated between 1 and 0 depending on whether or not a current flows by the application of a voltage to the gate of the memory cell transistor MT. In the present embodiment, it is postulated that the case where a current flows is represented by information "0" and the case where no current flows is represented by information "1" for the sake of convenience in explanation. It is further postulated in the present invention that a state in which no current flows through all the memory cell transistors is established (i.e., a state "1" is established in the present embodiment) through the erase operation.

A program operation (reduction in threshold voltage) of the nonvolatile memory is executed by extracting electrons from the floating gate of the memory cell transistor MT. In this case, the extraction of electrons from the floating gate is executed as follows.

That is, a negative voltage Vnw (−8 V, for example) is applied to the control gate of the memory cell transistor MT, and a positive voltage Vpp (4 V, for example) is applied to the drain. In the case of a memory cell array which takes the form of a virtual ground system, the source of the memory cell transistor MT is common to the source of the adjacent memory cell transistor MT, and therefore, the voltage at the source becomes Vpp or a floating state (+1 V is acceptable). Under such a application voltage condition, electrons are extracted from the floating gate to the drain region by FN (Fowler-Nordheim) tunnel phenomenon. As a result, the threshold voltage of the memory cell transistor MT is reduced and the program operation is completed.

The erase operation (increase in threshold voltage) of the nonvolatile memory is executed by injecting electrons into the floating gate of the memory cell transistor MT. In this case, the injection of electrons into the floating gate is executed as follows.

That is, a positive voltage Vpe (+10 V, for example) is applied to the control gate of the memory cell transistor MT, and a negative voltage Vns (−8 V, For example) is applied to the drain and the source. Then, electrons are injected into the floating gate by the FN tunnel phenomenon. Consequently, the threshold voltage of the memory cell transistor is increased to become not lower than about 3 V.

In the read operation of the nonvolatile memory, a power voltage Vcc is applied to the control gate, a voltage Vbias (1 V, for example) is applied to the source (drain) and the ground voltage Vss is applied to the drain (source). Then, the read operation is executed by discriminating the held information depending on whether or not a current flows through the memory cell transistor MT.

The application voltages in the program mode, erase mode and read mode are listed in Table 1.

TABLE 1

|  | Control gate | Drain | Source | P-type well |
| --- | --- | --- | --- | --- |
| Program | −8 V | 4 V/* | 4 V/* | 0 V |
| Erase | 10 V | −8 V | −8 V | −8 V |
| Read | 3 V | 0 V | 1 V | 0 V |

*: Floating state or +1 V

Figure 2:
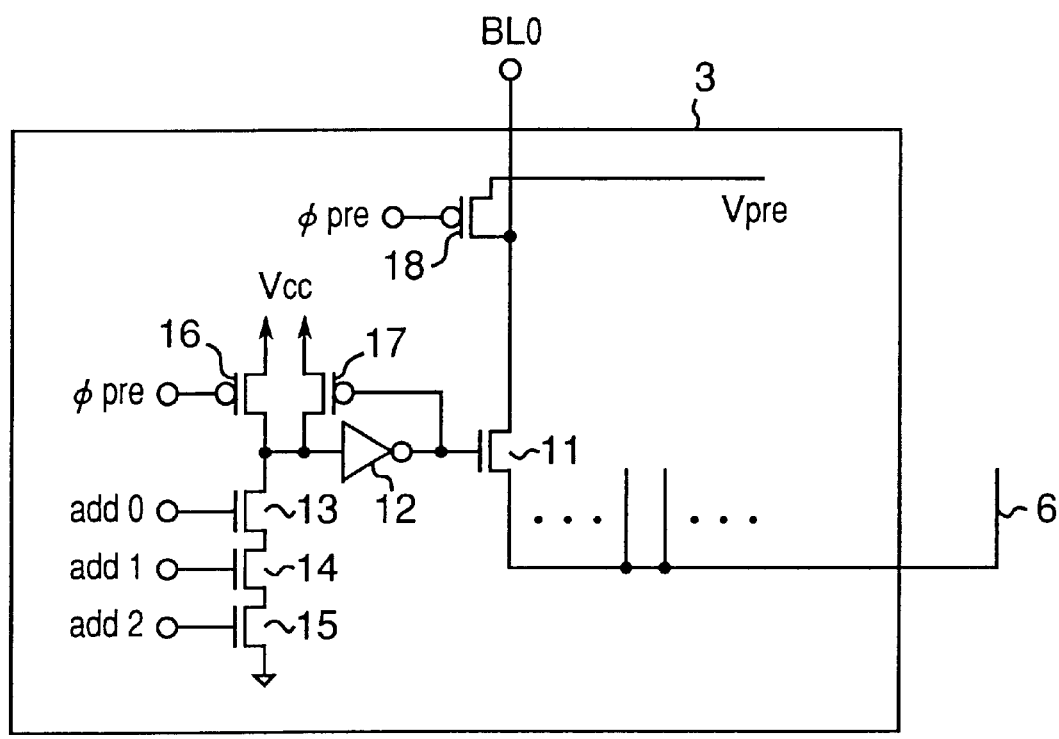
FIG. 2 is a concrete circuit diagram showing an example of a column decoder circuit shown in FIG. 1.

FIG. 2 is a concrete circuit diagram showing an example of the column decoder circuit 3. It is to be noted that FIG. 2 shows the circuit of only the portion of the bit line BL0 and the portions of the other bit lines BL1 through BLm are not shown. This column decoder circuit 3 is a normal column decoder circuit which has been conventionally used.

The bit line BL0 and the data line 6 are connected to each other via a transistor 11. Then, the gate of this transistor 11 is grounded via an inverter 12 and three transistors 13, 14 and 15 connected in series. The input terminal of the inverter 12 is connected to the power source Vcc via a transistor 16. Further, the input terminal of the inverter 12 is connected to the power source Vcc via a transistor 17 whose gate is connected to the output terminal of the inverter 12.

The bit line BL0 is connected to the pre-charge source Vpre via a transistor 18 which is turned on and off by the pre-charge signal φpre.

In the column decoder circuit 3 having the above construction, a specified bit line BL is selected in the case of a specified address in the program operation, erase operation and read operation. In the case of the example shown in FIG. 2, the transistor 11 is turned on when the levels of column address signals add0, add1 and add2 are "H", so that the bit line BL0 is selected to be connected to the data line 6.

In contrast to this, the transistor 11 is turned off when the level of the pre-charge signal φpre is "L", so that the bit line BL0 is not connected to the data line 6.

The verify operation of the memory cell array 1 of the semiconductor storage device having the above construction is executed according to the following procedure.

First, the level of the collective erase verify mode selection signal φaev is made to be "L" to turn off the transistors TNs1 and TN0 through TNm and turned on the transistor TNs2. Thus, the common bit line 5 is disconnected from the bit lines BL0 through BLm and the sense amplifier 8. Further, the level of the pre-charge signal φpre is made to be "L" to turn off the transistor 11, thereby disconnecting the bit line BL0 from the data line 6. At the same time, the transistors 9 and 18 are turned on to individually charge the common bit line 5 and the bit line BL0 with the pre-charge voltage Vpre. It is to be noted that the other bit lines BL1 through BLm are charged in a similar manner.

Next, the level of the pre-charge signal φpre is made to be "H" to turn off the transistors 9, 18, 18, thereby stopping the pre-charging of the common bit line 5 and the bit lines BL0 through BLm. Until this stage, all the word lines WL0 through WLn are in a non-selected state.

Next, the level of the collective erase verify mode selection signal φaev is made to be "H" to connect the common bit line 5 to the bit lines BL0 through BLm and the sense amplifier 8, and to disconnect the data line 6 from the sense amplifier 8. Then, all the word lines WL0 through WLn are selected by the row decoder circuit 2. In this case, if all the memory cells are erased to have information "1" and all the memory cell transistors MT00, . . . , MTnnm are in a state in which no current flows therethrough, the pre-charge voltage Vpre of the common bit line 5 and all the bit lines BL0 through BLm is not reduced. Consequently, the level of the output signal OUT from the sense amplifier 8 remains "H".

In contrast to this, when at least one non-erased memory cell exists, the memory cell transistor MT of the memory cell is in a state in which a current flows therethrough, and the pre-charge voltage Vpre at the common bit line 5 is discharged via the memory cell transistor MT and the Vss line 4 to be reduced. Consequently, the level of the output signal OUT from the sense amplifier 8 becomes "L".

That is, the event that not all the memory cells have been erased can be accurately collectively detected by the change in level of the output signal OUT of the sense amplifier 8 to "L", thereby allowing the verify operation to be executed accurately collectively on all the memory cells.

As described above, in the present embodiment, all the bit lines BL0 through BLm are connected to the input terminal of the sense amplifier 8 via the transistors TN0 through TNm which are turned on and off by the collective erase verify mode selection signal φaev and the common bit line 5, thereby allowing the common bit line 5 to be electrically connected and disconnected from the bit lines BL0 through BLm and the sense amplifier 8 by the collective erase verify mode selection signal φaev. The common bit line 5 is connected to the pre-charge power source Vpre via the transistor 9 which is turned on and off by the pre-charge signal φpre, while the bit lines BL0 through BLm are connected to the pre-charge power source Vpre via the transistors 18, 18, . . . which are turned on and off by the pre-charge signal φpre.

When executing a verify operation on the memory cell array 1, it is executed according to the following procedure.

(1) The levels of the collective erase verify mode selection signal φaev and the pre-charge signal φpre are made to be "L" to individually charge the common bit line 5 and all the bit lines BL0 through BLm with the pre-charge voltage Vpre.

(2) The level of the pre-charge signal φpre is made to be "H" to stop the charging of the common bit line 5 and all the bit lines BL0 through BLm.

(3) The level of the collective erase verify mode selection signal φaev is made to be "H" to select all the word lines WL0 through WLn by means of the row decoder circuit 2, and the event that the level of the output signal OUT from the sense amplifier 8 becomes "L" is watched.

Thus the event that the common bit line 5 is discharged due to the existence of the non-erased memory cell in the memory cell array 1 is detected.

In this case, the discharge of the common bit line 5 occurs when at least one non-erased memory cell transistor MT exists in the memory cell array 1, and therefore, the verify operation can be accurately collectively executed on all the memory cells.

Second Embodiment

In the present second embodiment, the data line is made to have the function of the common bit line 5 shown in FIG. 1.

Figure 3:
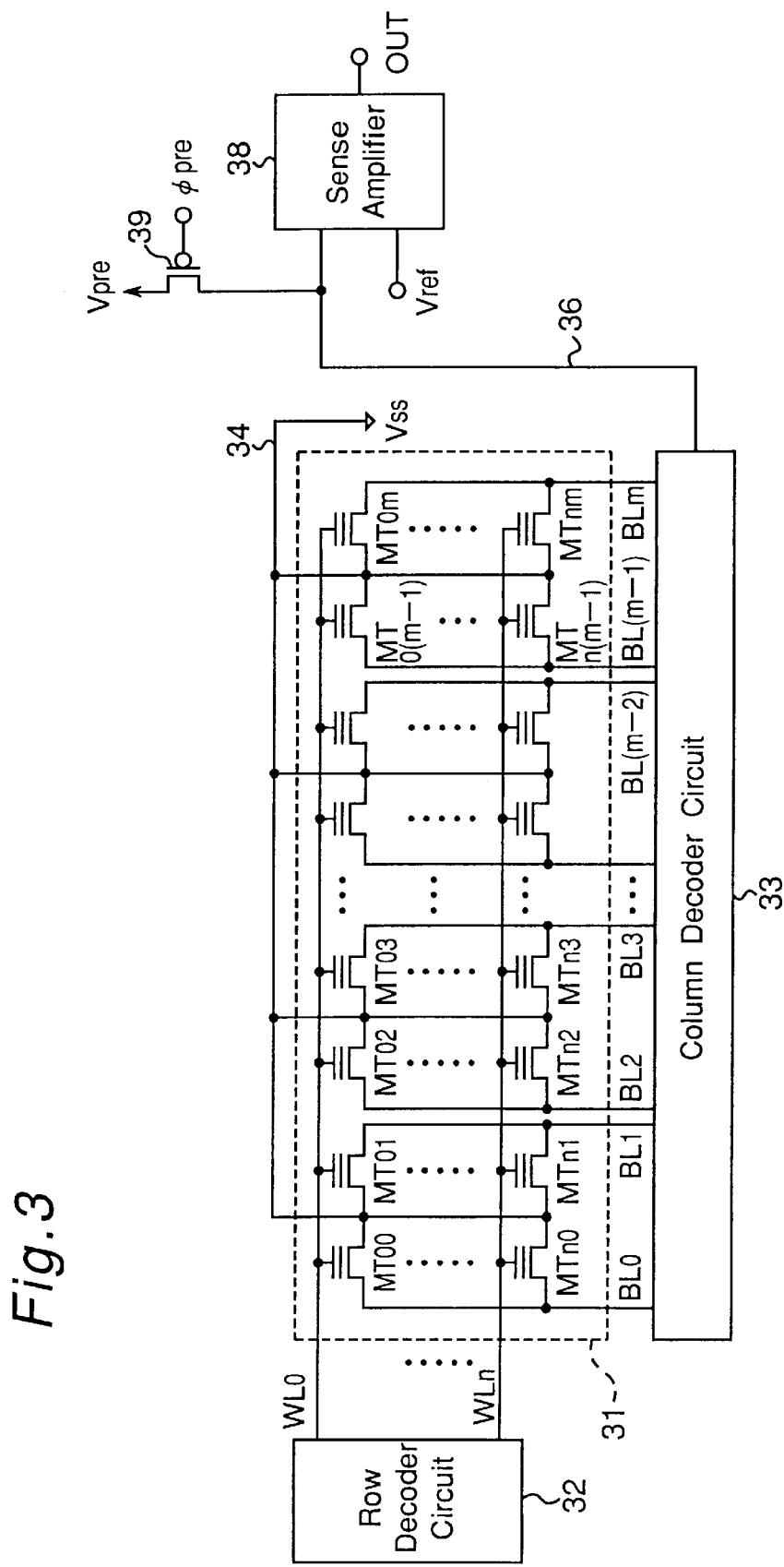
FIG. 3 is a schematic diagram of a semiconductor storage device different from that of FIG. 1.

FIG. 3 is a schematic diagram of the semiconductor storage device of the present second embodiment.

A memory cell array 31, a row decoder circuit 32, a Vss line 34, a data line 36 and a sense amplifier 38 have the same constructions and functions as those of the memory cell array 1, row decoder circuit 2, Vss line 4, data line 6 and sense amplifier 8 of the first embodiment.

The present second embodiment has nothing corresponding to the common bit line 5, transistors TN0 through TN$m$ which connect the common bit line 5 to the bit lines BL0 through BL$m$, transistor TNs1 which connects the common bit line 5 to the sense amplifier 8, inverter 10 and transistor TNs2 in the first embodiment, while the data line 36 is directly connected to the sense amplifier 38. Then, the data line 36 is connected to the pre-charge power source Vpre via a transistor 39 which is turned on and off by the pre-charge signal φpre.

Figure 4:
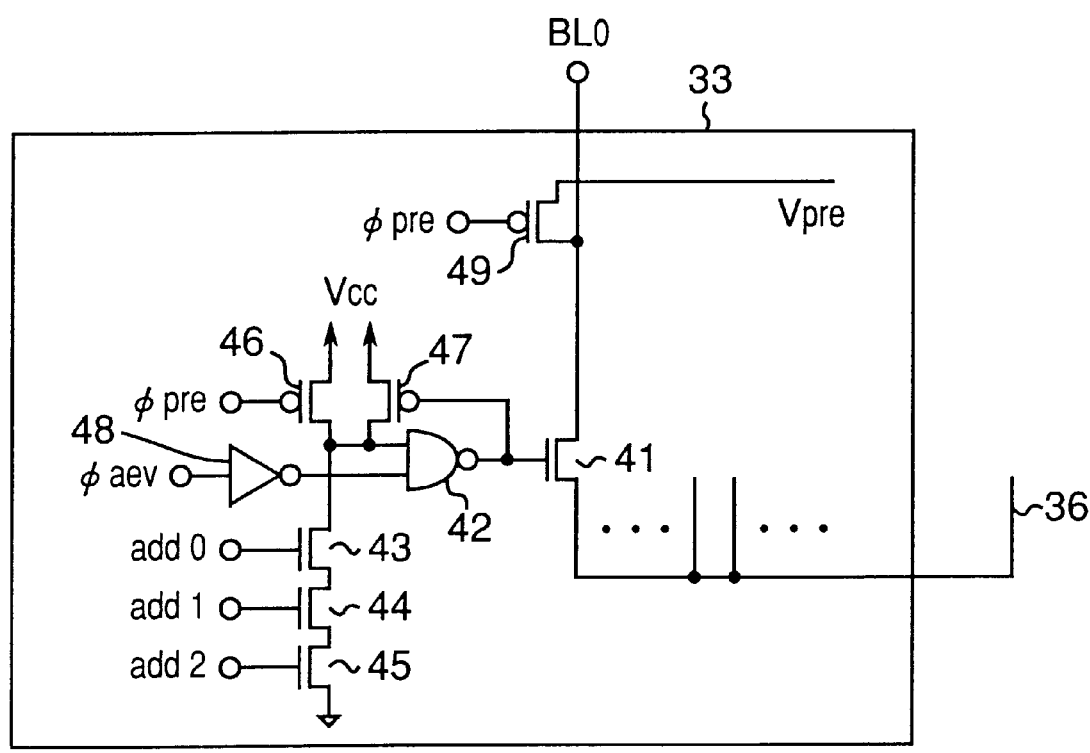
FIG. 4 is a concrete circuit diagram showing an example of a column decoder circuit shown in FIG. 3.

FIG. 4 is a concrete circuit diagram showing an example of the column decoder circuit 33 of the present second embodiment. It is to be noted that FIG. 4 shows the circuit of only the portion of the bit line BL0 and the portions of the other bit lines BL1 through BL$m$ are not shown.

The bit line BL0 and the data line 36 are connected to each other via a transistor 41. Then, the gate of this transistor 41 is connected to the output terminal of a NAND logic circuit 42, while one input terminal of this NAND logic circuit 42 is grounded via three transistors 43, 44 and 45 connected in series. Further, the one input terminal of the NAND logic circuit 42 is connected to the power source Vcc via a transistor 47 whose gate is connected to the output terminal of the NAND logic circuit 42 and a transistor 46. The other input terminal of the NAND logic circuit 42 receives the collective erase verify mode selection signal φaev via an inverter 48.

Further, the bit line BL0 is connected to the pre-charge power source Vpre via a transistor 49 which is turned on and off by the pre-charge signal φpre.

In the column decoder circuit 33 having the above construction, a specified bit line BL is selected to be connected to the data line 36 in the case of a specified address in the program operation, erase operation and read operation. In the case of the example shown in FIG. 4, the transistor 41 is turned on regardless of the levels of the collective erase verify mode selection signal φaev and the pre-charge signal φpre when the levels of the column address signals add0, add1 and add2 are "H", so that the bit line BL0 is selected to be connected to the data line 36.

When the levels of the pre-charge signal φpre and the collective erase verify mode selection signal φaev are "L", the transistor 41 is turned off and the bit line BL0 is not connected to the data line 36.

In contrast to this, the column decoder circuit 33 operates as follows in the verify operation.

First, the levels of the collective erase verify mode selection signal φaev and the pre-charge signal φpre are made to be "L" to turn off the transistor 41, thereby disconnecting the bit line BL0 from the data line 36. Then, the bit line BL0 is charged with the pre-charge voltage Vpre via the transistor 49, while the data line 36 is charged with the pre-charge voltage Vpre via the transistor 39. It is to be noted that the other bit lines BL1 through BL$m$ are also charged in a similar manner.

Next, the voltage level of the pre-charge signal φpre is made to be "H" to turn off the transistors 46, 39 and 49, thereby stopping the charging of the bit lines BL0 through BL$m$ and the data line 36. Until this stage, all the word lines WL0 through WL$n$ are in the non-selected state.

Next, the level of the collective erase verify mode selection signal φaev is made to be "H" to turn on the transistors 41, 41, . . . , thereby connecting the bit lines BL0 through BL$m$ to the data line 36. When all the word lines WL0 through WL$n$ are selected by the row decoder circuit 2, the pre-charge voltage Vpre at the data line 36 reduces via the corresponding memory cell transistor MT and the Vss line 34 if any non-erased memory cell exists. Consequently, the level of the output signal OUT from the sense amplifier 38 becomes "L".

That is, in the present second embodiment, the data line 36 is made to function similar to the common bit line 5 of the first embodiment, thereby accurately collectively executing the verify operation on all the memory cells.

Therefore, according to the present second embodiment, the verify operation can be accurately collectively executed on all the memory cells with the simple construction in which the NAND logic circuit 42 and the inverter 48 are merely provided in place of the inverter 12 of the column decoder circuit (see FIG. 2) of the normal semiconductor storage device, so that a substantial cost reduction can be achieved as compared with the first embodiment.

Third Embodiment

The present third embodiment is related to a virtual ground system semiconductor storage device for accurately collectively executing a verify operation on all memory cells.

Figure 5:
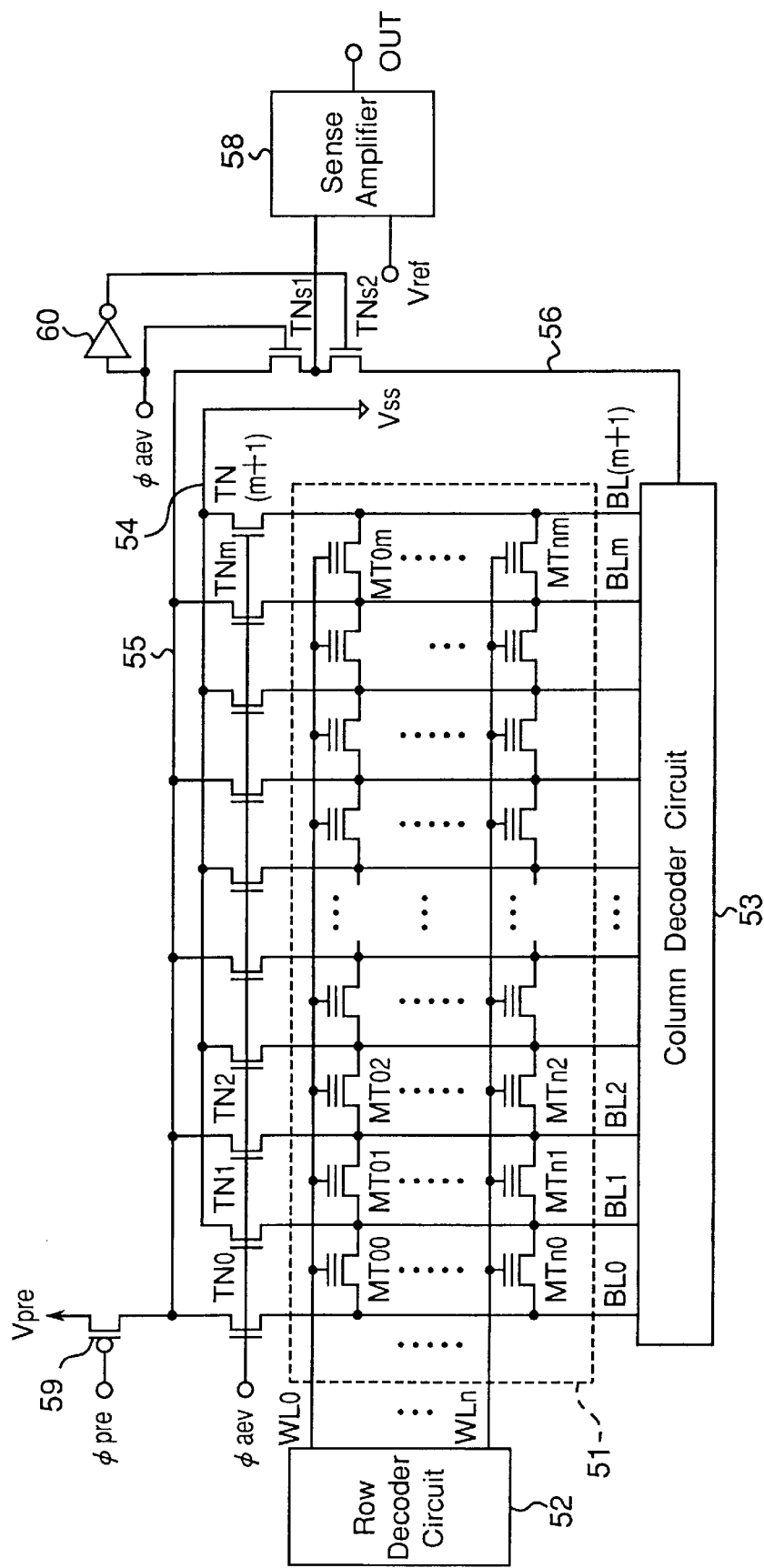
FIG. 5 is a schematic diagram of a semiconductor storage device different from those of FIGS. 1 and 3.

FIG. 5 is a schematic diagram of the virtual ground system semiconductor storage device.

A row decoder 52, a Vss line 54, a common bit line 55, a data line 56, a sense amplifier 58, a transistor 59, an inverter 60, a transistor TNs1 and a transistor TNs2 have the same constructions and functions as those of the row decoder circuit 2, Vss line 4, common bit line 5, data line 6, sense amplifier 8, transistor 9, inverter 10, transistor TNs1 and transistor TNs2 of the first embodiment.

A memory cell array 51 in the present third embodiment has a construction as follows.

That is, the control gates of the memory cell transistors MT00, . . . , MT$nm$ constituting the memory cell array 51 are connected to the word lines WL0, . . . , WL$n$ connected to the output terminals of the row decoder 52 similarly to the case of the memory cell array 1 of the first embodiment.

The drains of the memory cell transistors MT00, . . . , MT$n$0 arranged in the first column are connected to the bit line BL0 connected to the first output terminal of a column decoder circuit 53. On the other hand, the sources are connected to the bit line BL1 connected to the second output terminal of the column decoder circuit 53 together with the sources of the memory cell transistors MT01, MT$n$1 arranged in the second column. The drains of the memory cell transistors MT01, . . . , MT$n$1 arranged in the second column are connected to the bit line BL2 connected to the third output terminal of the column decoder circuit 53 together with the drains of the memory cell transistors MT02, ..., MTn2 arranged in the third column. Similarly, the drains and sources of memory cell transistors MT arranged in adjacent two columns are connected to an identical bit line BL, and the sources of the memory cell transistors MT0m, ..., MTnm arranged in the last (m+1)th column are connected to a bit line BL(m+1) connected to the last (m+1)th output terminal of the column decoder circuit 53.

Among the bit lines BL0 through BL(m+1), the even-numbered bit lines BL0, BL2, ..., BLm (referred to as "even-number bit lines" hereinafter since they are denoted by even numbers) are connected to the common bit line 55 via transistors TN0, TN2, ..., TNm. On the other hand, odd-numbered bit lines BL1, BL3, ..., BL(m+1) (referred to as "odd-number bit lines" hereinafter since they are denoted by odd numbers) are connected to the Vss line 54 via transistors TN1, TN3, ..., TN(m+1).

Figure 6:
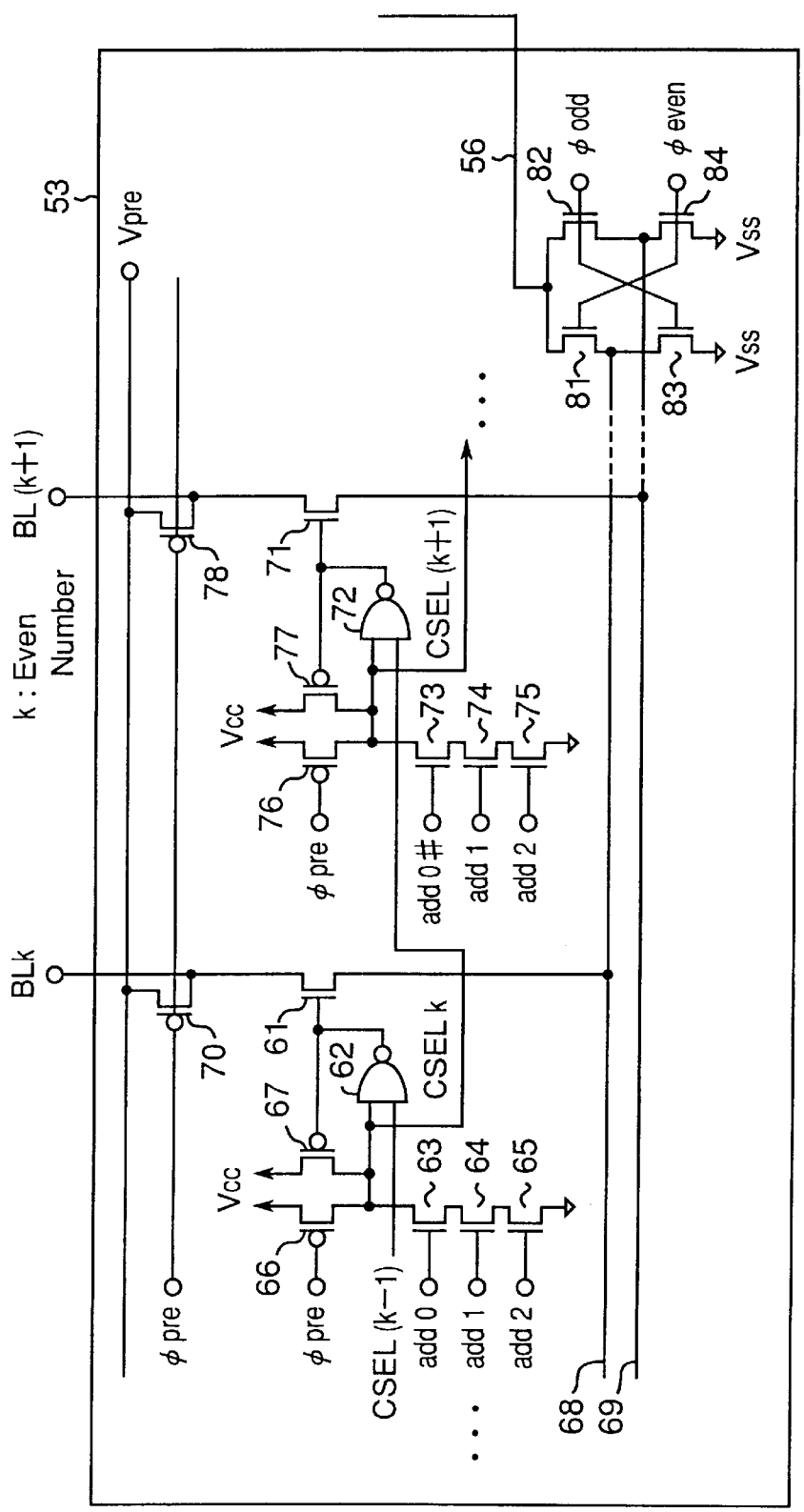
FIG. 6 is a concrete circuit diagram showing an example of a column decoder circuit shown in FIG. 5.

FIG. 6 is a concrete circuit diagram showing an example of the column decoder circuit 53 of the present third embodiment. It is to be noted that the even- and odd-number bit lines are represented by an even-number bit line BLk denoted by a number k (k: even numbers including 0) and an odd-number bit line BL(k+1) denoted by a number (k+1), respectively, in FIG. 6.

The even-number bit line BLk is connected to an even-number address data line 68 via a transistor 61. Then, the gate of this transistor 61 is connected to the output terminal of a NAND logic circuit 62, and one input terminal of this NAND logic circuit 62 is grounded via three transistors 63, 64 and 65 connected in series. Further, the one input terminal of the NAND logic circuit 62 is connected to the power source Vcc via a transistor 67 whose gate is connected to the output terminal of the NAND logic circuit 62 and a transistor 66. The other input terminal of the NAND logic circuit 62 receives a column selection signal CSEL (k−1) from the bit line BL(k−1) side.

The odd-number bit line BL(k+1) is connected to an odd-number address data line 69 via a transistor 71. Then, the gate of this transistor 71 is connected to the output terminal of a NAND logic circuit 72, and one input terminal of this NAND logic circuit 72 is grounded via three transistors 73, 74 and 75 connected in series. Further, the one input terminal of the NAND logic circuit 72 is connected to the power source Vcc via a transistor 77 whose gate is connected to the output terminal of the NAND logic circuit 72 and a transistor 76. The other input terminal of the NAND logic circuit 72 is connected to the one input terminal of the NAND logic circuit 62 on the even-number bit line BLk side, and an input signal to the one input terminal of the NAND logic circuit 62 is inputted as a column selection signal CSELk.

Then, an input signal to the one input terminal of the NAND logic circuit 72 is outputted as a column selection signal CSEL(k+1) to the next even-number bit line BL(k+2) side.

Further, the even-number bit line BLk is connected to the pre-charge power source Vpre via a transistor 70 which is turned on and off by the collective erase verify mode selection signal φaev. Similarly, the odd-number bit line BL(k+1) is connected to the pre-charge power source Vpre via a transistor 78 which is turned on and off by the collective erase verify mode selection signal φaev.

The even-number address data line 68 is connected to the data line 56 via a transistor 81, while the odd-number address data line 69 is connected to the data line 56 via a transistor 82. Further, the even-number address data line 68 is connected to the ground Vss via a transistor 83, while the odd-number address data line 69 is connected to the ground Vss via a transistor 84. Then, an even-number address selection signal φeven is commonly supplied to the gates of the transistors 81 and 84, while an odd-number address selection signal φodd is commonly supplied to the transistors 82 and 83.

In the column decoder circuit 53 having the above construction, specified adjacent two bit lines are selected in the case of a specified address and connected to the even-number address data line 68 and the odd-number address data line 69 in the program operation, erase operation and read operation.

In the case of the example shown in FIG. 6, when the levels of the column address signals add0, add1 and add2 become "H", the level of the one input terminal of the NAND logic circuit 62 becomes "L" to turn on the transistor 61 regardless of the levels of the pre-charge signal φpre and the column selection signal CSEL(k−1). Further, the signal of level "L" to the one input terminal of the NAND logic circuit 62 is inputted as the column selection signal CSELk to the other input terminal of the NAND logic circuit 72, so that the transistor 71 is turned on regardless of the levels of the pre-charge signal φpre and the column address signals add0#, add1 and add2.

Thus, the even-number bit line BLk is selected to be connected to the even-number address data line 68, while the odd-number bit line BL(k+1) is selected to be connected to the odd-number address data line 69.

In this case, the level of the column address signal add0# is "L", and therefore, the level of the one input terminal of the NAND logic circuit 72 remains "H", and the level of the column selection signal CSEL(k+1) to the next bit line BL(k+2) becomes "H". Therefore, the next bit line BL(k+2) is not selected.

When connecting the even-number address data line 68 to the data line 56 in the above case, it is proper to set the level of the even-number address selection signal φeven to "H" and set the level of the odd-number address selection signal φodd to "L". When connecting the odd-number address data line 69 to the data line 56, it is proper to set the level of the even-number address selection signal φeven to "L" and set the level of the odd-number address selection signal φodd to "H".

A verify operation is basically executed on the memory cell array 51 of the semiconductor storage device having the above construction as follows similarly to that of the first embodiment.

In this case, the power voltage Vcc is supplied as a column selection signal CSEL0.

First, the level of the collective erase verify mode selection signal φaev is made to be "L" to disconnect the common bit line 55 from the even-number bit line BLk and the sense amplifier 58. Further, the level of the pre-charge signal φpre is made to be "L" to disconnect all the bit lines BLk and BL(k+1) from the data line 56 and simultaneously individually charge the common bit line 55 and the bit lines BLk and BL(k+1) with the pre-charge voltage Vpre.

Next, the level of the pre-charge signal φpre is made to be "H" to stop the pre-charging of the common bit line 55 and the bit lines BLk and BL(k+1). Until this stage, all the word lines WL0 through WLn are in the non-selected state.

Next, the level of the collective erase verify mode selection signal φaev is made to be "H" to connect the common bit line 55 to the even-number bit line BLk and the sense amplifier 58 and connect the odd-number bit line BL(k+1) to the Vss line 54. Further, all the word lines WL0 through WLn are selected by the row decoder 52. Then, if any non-erased memory cell exists in the memory cell array 51, the voltage at the common bit line 55 reduces from the pre-charge voltage Vpre via the odd-number bit line BL(k+1) and the Vss line 54 connected to the source of the corresponding memory cell transistor MT. Consequently, the level of the output signal OUT from the sense amplifier 58 becomes "L".

That is, in the virtual ground system semiconductor storage device of the present third embodiment, the even-number bit lines BL0, BL2, . . . , BLm are connected to the sense amplifier 58 via the transistors TN0, TN2, . . . , TNm and the common bit line 55, while the odd-number bit lines BL1, BL3, . . . , BL(m+1) are connected to the Vss line 54 via the transistors TN1, TN3, TN(m+1), thereby allowing the common bit line 55 to be electrically connected and disconnected from the even-number bit lines BL0, BL2, . . . , BLm and allowing the Vss line 54 to be electrically connected and disconnected from the odd-number bit lines BL1, BL3, . . . , BL(m+1) according to the level of the collective erase verify mode selection signal φaev. When executing a verify operation on the memory cell array 51, it is executed according to the following procedure.

(1) The levels of the collective erase verify mode selection signal φaev and the pre-charge signal φpre are made to be "L" to individually charge the common bit line 55 and all the bit lines BL0 through BL(m+1) with the pre-charge voltage Vpre.

(2) The level of the pre-charge signal φpre is made to be "H" to stop the charging of the common bit line 55 and all the bit lines BL0 through BL(m+1).

(3) The level of the collective erase verify mode selection signal φaev is made to be "H", and all the word lines WL0 through WLn are selected by means of the row decoder circuit 52, and the event that the level of the output signal OUT from the sense amplifier 58 becomes "L" is watched.

Thus, the event that the common bit line 55 has been discharged due to the existence of the non-erased memory cell in the memory cell array 51 is detected.

In this case, the discharge of the common bit line 55 occurs when at least one non-erased memory cell transistor MT exists in the memory cell array 51, and therefore, the verify operation can be accurately collectively executed on the memory cell array 51 of the virtual ground system semiconductor storage device.

Fourth Embodiment

In the present fourth embodiment, an even-number address data line and a data line are made to have the function of the common bit line 55 shown in FIG. 5 and an odd-number address data line is made to have the function of the Vss line 54.

Figure 7:
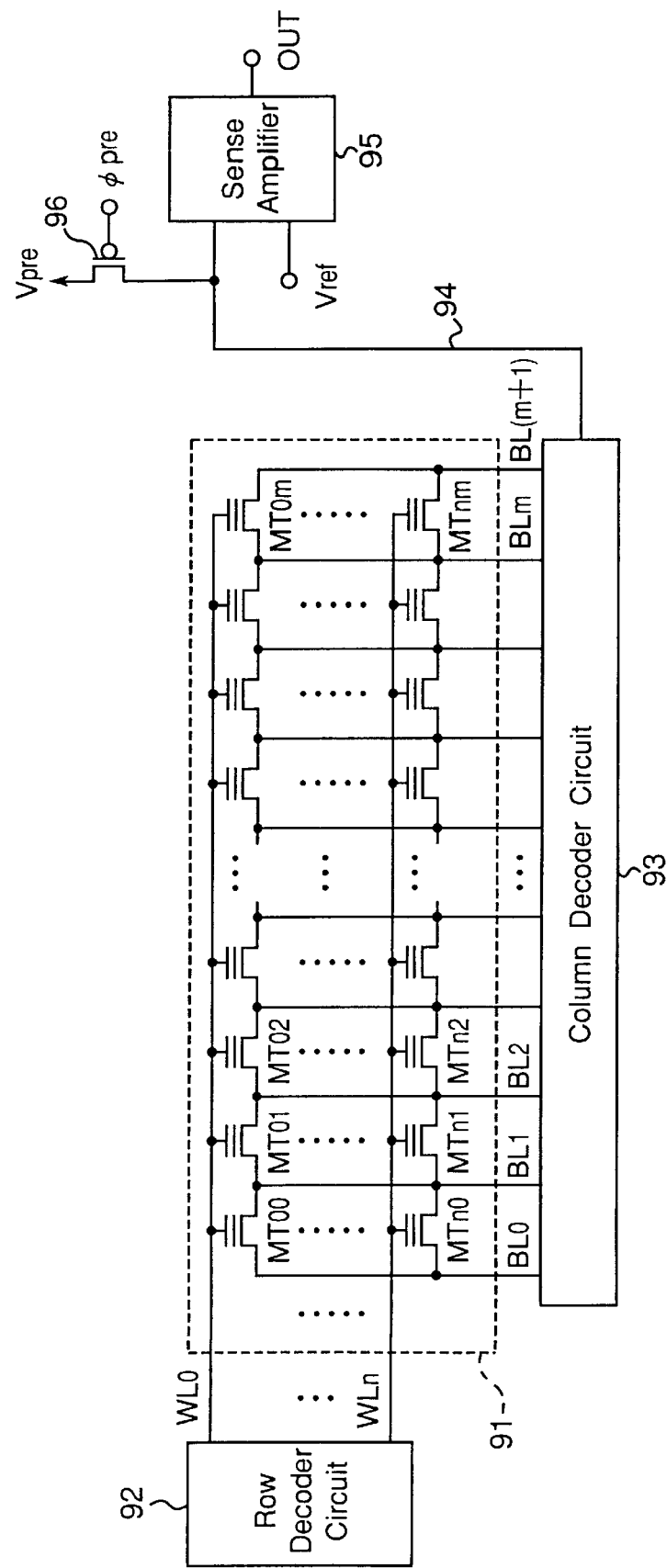
FIG. 7 is a schematic diagram of a semiconductor storage device different from those of FIGS. 1, 3 and 5.

FIG. 7 is a schematic diagram of the semiconductor storage device of the present fourth embodiment.

A memory cell array 91, a row decoder circuit 92, a data line 94 and a sense amplifier 95 have the same constructions and functions as those of the memory cell array 51, row decoder circuit 52, data line 56 and sense amplifier 58 of the third embodiment shown in FIG. 5.

The present fourth embodiment has nothing corresponding to the common bit line 55, transistors TN0, TN2, . . . , TNm which connect the common bit line 55 to the even-number bit lines BL0, BL2, . . . , BLm, transistor TNs1 which connects the common bit line 55 to the sense amplifier 58, inverter 60, transistor TNs2, Vss line 54 and transistors TN1, TN3, . . . , TN(m+1) which connect the Vss line 54 to the bit lines BL1, BL3, . . . , BL(m+1) in the third embodiment shown in FIG. 5, while the data line 94 is directly connected to the sense amplifier 95. Then, the data line 94 is connected to the pre-charge power source Vpre via a transistor 96 which is turned on and off by the pre-charge signal φpre.

Figure 8:
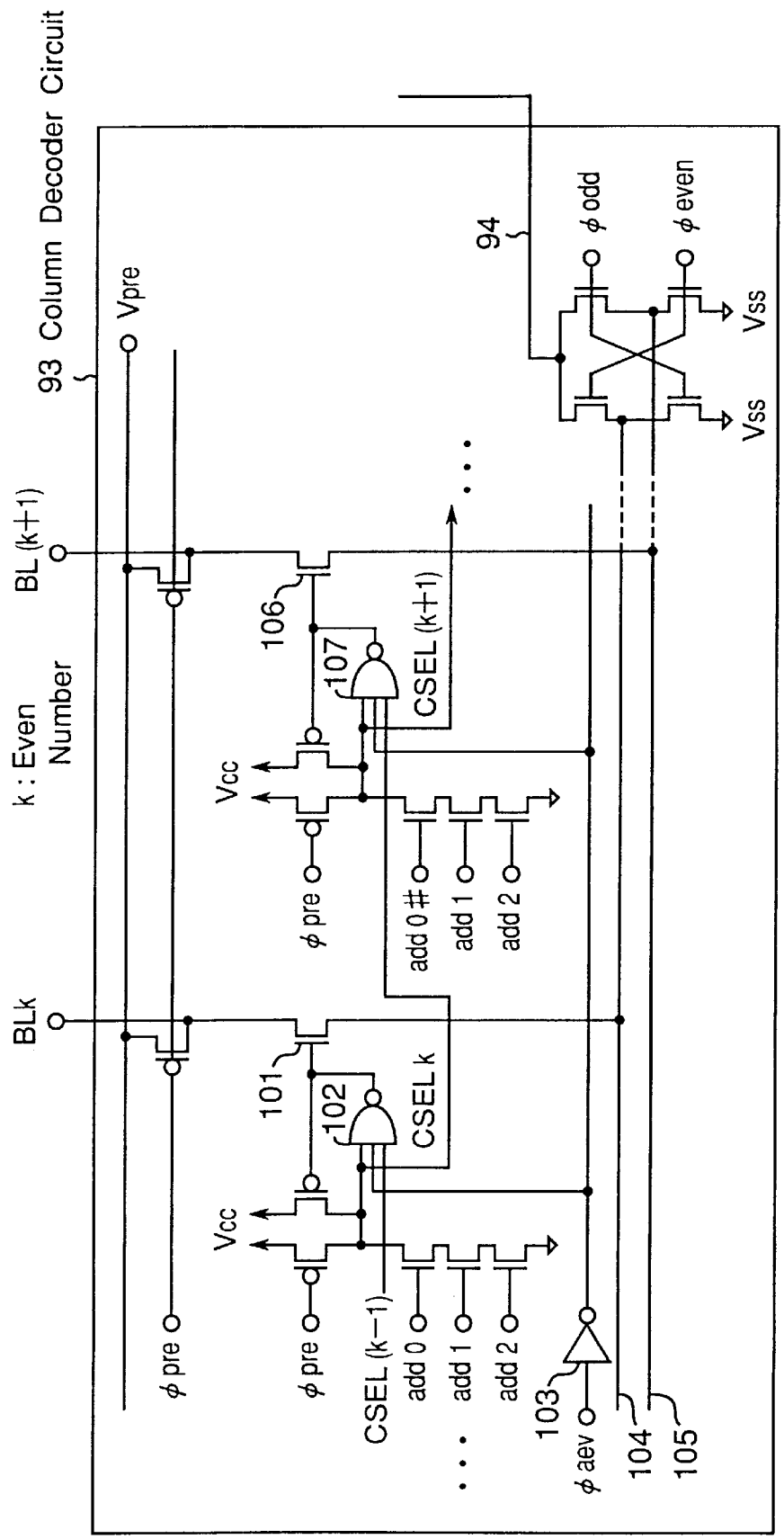
FIG. 8 is a concrete circuit diagram showing an example of a column decoder circuit shown in FIG. 7.

FIG. 8 is a concrete circuit diagram showing an example of a column decoder circuit 93 of the present fourth embodiment. It is to be noted that the even- and odd-number bit lines are represented by an even-number bit line BLk denoted by a number k (k: even numbers including 0) and an odd-number bit line BL(k+1) denoted by a number (k+1), respectively, in FIG. 8.

The column decoder circuit 93 of the present fourth embodiment has basically the same construction as that of the column decoder circuit 53 of the third embodiment. It is to be noted that NAND logic circuits 102 and 107 of the present fourth embodiment receive a collective erase verify mode selection signal φaev via an inverter 103.

Figure 9:
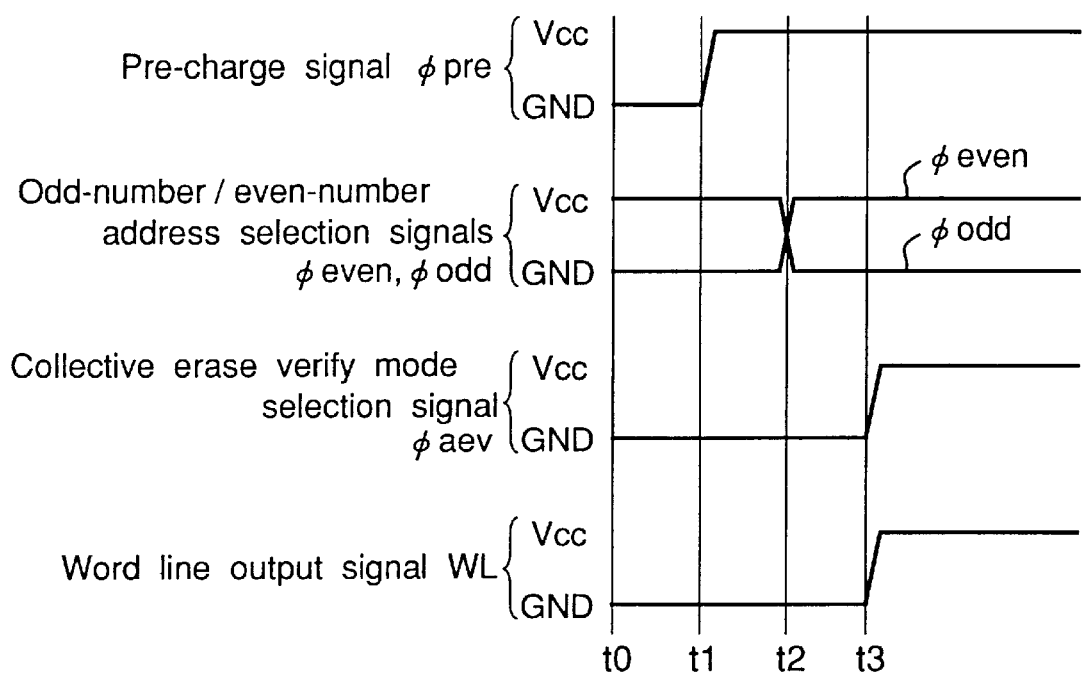
FIG. 9 is a timing chart of the verify operation of the semiconductor storage device shown in FIG. 7.

The semiconductor storage device having the above construction executes the collective verify operation as follows. FIG. 9 is a timing chart of signals in the verify operation. The verify operation will be described below with reference to FIG. 9.

First, at a time point t0, the levels of the collective erase verify mode selection signal φaev and the pre-charge signal φpre are made to be "L", so that the levels of the output signals of the NAND logic circuits 102 and 107 are made to be "L". Thus, the even-number bit line BLk is disconnected from an even-number address data line 104, while the odd-number bit line BL(k+1) is disconnected from an odd-number address data line 105. At the same time, the data line 94 and all the bit lines BLk and BL(k+1) are individually charged with the pre-charge voltage Vpre.

Next, at a time point t1, the voltage level of the pre-charge signal φpre is made to be "H" to stop the charging of the data line 94 and all the bit lines BLk and BL(k+1).

Next, at a time point t2, the level of the even-number address selection signal φeven is made to be "H", while the level of the odd-number address selection signal φodd is made to be "L". Thus, the even-number address data line 104 is connected to the data line 94, while the odd-number address data line 105 is connected to the ground Vss. Consequently, the even-number address data line 104 is charged with the pre-charge voltage Vpre.

Next, at a time point t3, the level of the collective erase verify mode selection signal φaev is made to be "H", so that the outputs of the NAND logic circuits 102 and 107 are made to be "H" regardless of the levels of the column address signal and the pre-charge signal φpre. Thus, the even-number bit line BLk is connected to the even-number address data line 104, while the odd-number bit line BL(k+1) is connected to the odd-number address data line 105. Further, all the word lines WL0 through WLn are selected by the row decoder circuit 92. When any non-erased memory cell exists in the memory cell array 91, the data line 94 is discharged via the odd-number bit line BL(k+1) and the odd-number address data line 105 connected to the corresponding memory cell transistor MT, by which the pre-charge voltage Vpre reduces. Consequently, the level of the output signal OUT from the sense amplifier 95 becomes "L".

That is, in the present fourth embodiment, the even-number address data line 104 and the data line 94 are made to have a function similar to that of the common bit line 55 of the third embodiment, while the odd-number address data line 105 is made to have a function similar to that of the Vss line 54 of the third embodiment, thereby accurately collectively executing the verify operation on all the memory cells.

Therefore, according to the present fourth embodiment, the verify operation can be accurately collectively executed on all the memory cells with the simple construction in which the column decoder circuit (see FIG. 6) of the normal virtual ground system semiconductor storage device is merely provided with the inverter 103, so that a substantial cost reduction can be achieved as compared with the third embodiment.

Fifth Embodiment

The present fifth embodiment is related to a virtual ground system semiconductor storage device which execute a serial access and is able to accurately collectively execute a verify operation on all the memory cells.

Figure 10:
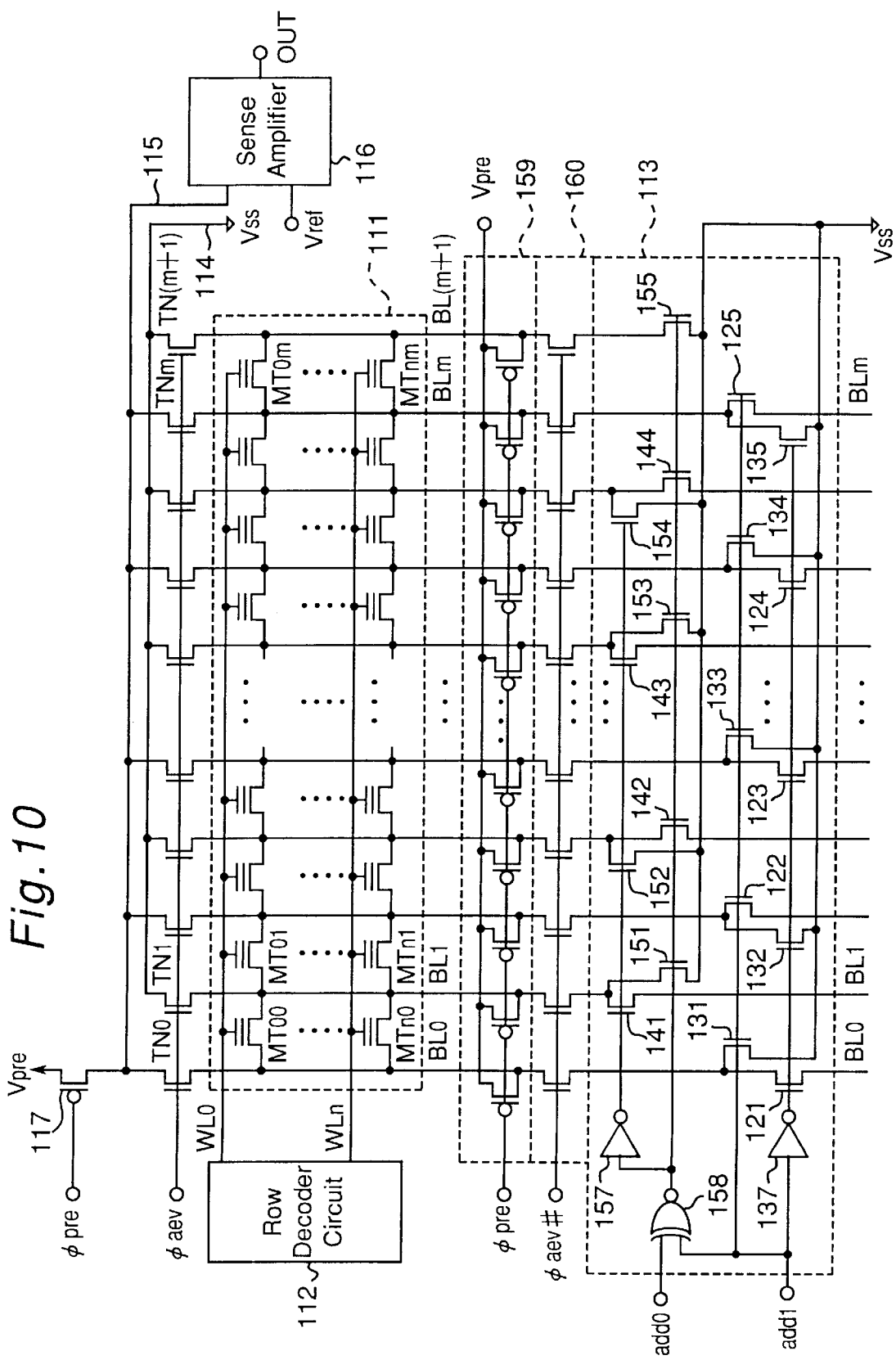
FIG. 10 is a schematic diagram of a semiconductor storage device different from those of FIGS. 1, 3, 5 and 7.
Figure 11:
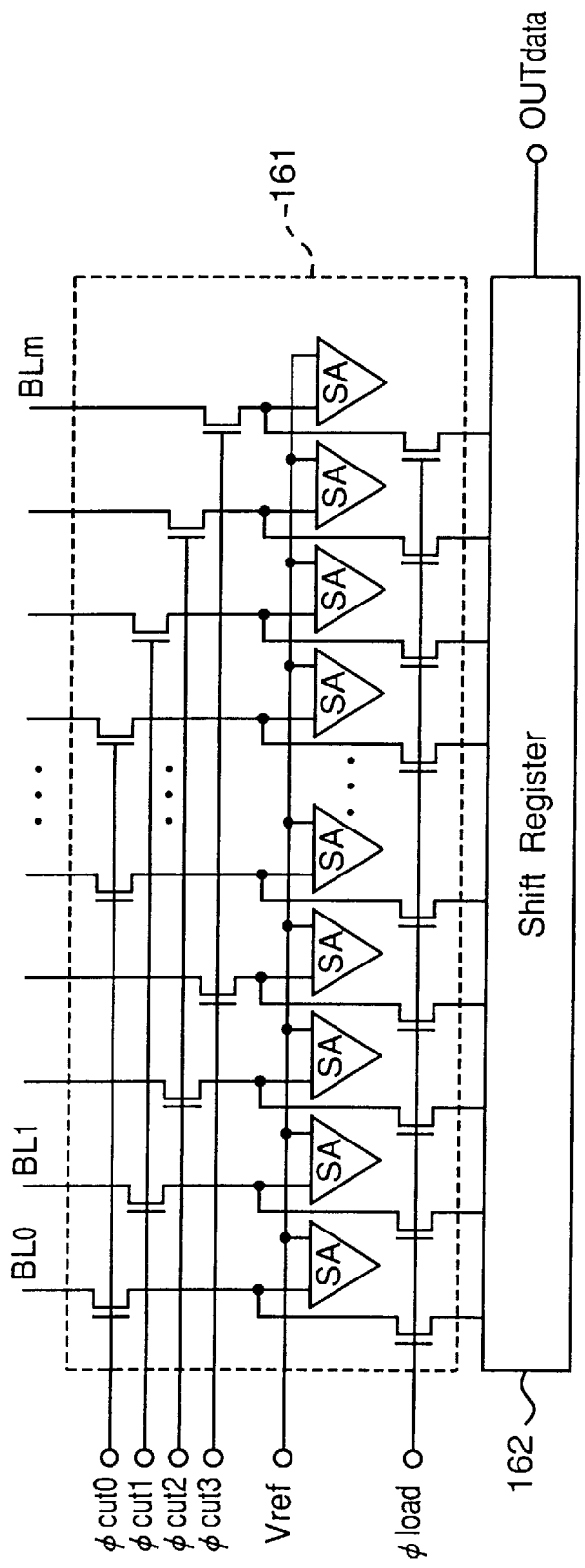
FIG. 11 is a schematic diagram continued from FIG. 10.

FIGS. 10 and 11 are schematic diagrams of the semiconductor storage device of the present fifth embodiment.

A memory cell array 111, a row decoder circuit 112, transistors TN0 through TN(m+1), a common bit line 115, a Vss line 114, a sense amplifier 116 and a transistor 117 have the same constructions and functions as those of the memory cell array 51, row decoder circuit 52, transistors TN0 through TN(m+1), common bit line 55, Vss line 54, sense amplifier 58 and transistor 59 of the third embodiment shown in FIG. 5.

The present fifth embodiment has nothing corresponding to the transistor TNs1, inverter 60 and transistor TNs2 of the third embodiment, while the common bit line 115 is directly connected to the sense amplifier 116.

A column decoder circuit 113 of the present fifth embodiment has a construction as follows.

That is, transistors 121 through 125 are inserted in the even-number bit lines BL0, BL2, . . . , BLm. Transistors 141 through 144 are inserted in the odd-number bit lines BL1, BL3, . . . , BL(m+1). Further, the even-number bit lines BL0, BL2, . . . , BLm are connected to the ground Vss via transistors 131 through 135. The odd-number bit lines BL1, BL3, . . . , BL(m+1) are connected to the ground Vss via transistors 151 through 155.

Then, the gates of the transistors 121, 132, 123, 124 and 135 are connected to the output terminal of an inverter 137. The gates of the transistors 131, 122, 133, 134 and 125 are connected to the input terminal of the inverter 137, and a column address signal add1 is supplied to the input terminal of the inverter 137. Further, the gates of the transistors 141, 152, 143 and 154 are connected to the output terminal of an inverter 157. The gates of the transistors 151, 142, 153, 144 and 155 are connected to the input terminal of the inverter 157, and the output terminal of an exclusive NOR logic circuit 158 is connected to the input terminal of the inverter 157. Then, the column address signal add1 is supplied to one input terminal of the exclusive NOR logic circuit 158, while a column address signal add0 is supplied to the other input terminal thereof.

All the bit lines BL0 through BL(m+1) between the column decoder circuit 113 and the memory cell array 111 are pre-charged with the pre-charge voltage Vpre by transistors 159 which are concurrently turned on and off by the pre-charge signal φpre. Further, the bit lines BL0 through BL(m+1) are concurrently turned on and off by transistors 160 according to a collective erase-verify mode selection signal φaev#.

Each of the bit lines BL0 through BLm is connected to one input terminal of a sense amplifier SA via a transistor which is turned on and off by any one of sense amplifier cut signals φcut0 through φcut3 in a sense amplifier section 161 shown in FIG. 11. Then, the other input terminal of each of the sense amplifiers SA is connected to a reference voltage Vref. The one input terminal of the sense amplifier SA is connected to a shift register 162 via a transistor which is turned on and off by a data transfer signal φload.

The semiconductor storage device having the above construction operates as follows.

That is, in the normal read operation, the level of the collective erase verify mode selection signal φaev is made to be "L" to turn off the transistors TN0 through TN(m+1). In this case, the level of the collective erase verify mode selection signal φaev# becomes "H", so that all the bit lines BL0 through BL(m+1) are electrically connected to the column decoder circuit 113 by the transistors 160. Subsequently, the bit line BL corresponding to the memory cell to be subjected to the read operation is selected by the column address signals add0 and add1 to be connected to the sense amplifier section 161. Table 1 shows the relationship between the levels of the column address signals add0 and add1 and the selected bit line BL.

TABLE 2

|  | I | II | III | IV |
|---|---|---|---|---|
| Column address signal add0 | L | L | H | H |
| Column address signal add1 | L | H | L | H |
| Bit line BL0 | SA | Vss | SA | Vss |
| Bit line BL1 | SA | Vss | Vss | SA |
| Bit line BL2 | Vss | SA | Vss | SA |
| Bit line BL3 | Vss | SA | SA | Vss |
| Bit line BL4 | SA | Vss | SA | Vss |
| . . . | . . . | . . . | . . . | . . . |

Notes:
SA: connected to sense amplifier 161
Vss: connected to ground Vss

For example, in the state II in which the level of the column address signal add0 is "L" and the level of the column address signal add1 is "H", the transistors 131, 122, 133, 134 and 125 and the transistors 151, 142, 153, 144 and 155 are turned on to connect the bit lines BL2, BL3, . . . to the corresponding sense amplifier SA and connect the bit lines BL0, BL1, BL4, . . . to the ground Vss.

Next, the level of the pre-charge signal φpre is made to be "L" to charge the bit lines BL with the pre-charge voltage Vpre via the transistors 159. When the word line WL corresponding to the memory cell to be subjected to the read operation is selected by the row decoder circuit 112, the magnitude of the threshold voltage of each memory cell transistor MT is checked as follows.

That is, in the state I, the magnitude of the threshold voltage of the memory cell transistor MT between the bit lines BL1 and BL2, and the magnitude of the threshold voltage of the memory cell transistor MT between the bit lines BL3 and BL4 and so forth are checked. It is to be noted that the bit lines BL2, BL3, . . . are connected to the ground Vss in this case.

In the state II, the magnitude of the threshold voltage of the memory cell transistor MT between the bit lines BL1 and BL2, and the magnitude of the threshold voltage of the memory cell transistor MT between the bit lines BL3 and BL4 and so forth are checked. It is to be noted that the bit lines BL1, BL4, . . . are connected to the ground Vss in this case.

In the state III, the magnitude of the threshold voltage of the memory cell transistor MT between the bit lines BL0 and BL1, and the magnitude of threshold voltage of the memory cell transistor MT between the bit lines BL2 and BL3 and so forth are checked. It is to be noted that the bit lines BL1, BL2, . . . are connected to the ground Vss in this case.

In the state IV, the magnitude of the threshold voltage of the memory cell transistor MT between the bit lines BL0 and BL1, and the magnitude of the threshold voltage of the memory cell transistor MT between the bit lines BL2 and BL3 and so forth are checked. It is to be noted that the bit lines BL0, BL3, are connected to the ground Vss in this case.

Consequently, when the information held in the memory cell transistor MT subjected to the threshold voltage checking is "0", the bit line BL connected to the sense amplifier SA is discharged since the memory cell transistor MT is turned on because its threshold voltage is low. When the held information is "1", the bit line is not discharged and keeps the pre-charge voltage Vpre.

Next, the levels of the sense amplifier cut signals φcut0 through φcut3 are made to be "L" according to the states I through IV to disconnect the corresponding bit line BL from the sense amplifier SA, thereby driving the sense amplifier SA. Then, the voltage at the bit line BL makes a transition to a voltage of a specified level corresponding to the magnitude relationship between the voltage at the bit line BL and the reference voltage Vref, and the data are transferred to the shift register 162 with the level of the data transfer signal φload made to be "H".

Thus, the data successively outputted in parallel from the bit lines BL0 through BLm are converted into serial data by the shift register 162 and outputted as an output signal OUTdata.

The verify operation of the semiconductor storage device having the above construction is executed as follows basically similarly to the first embodiment.

First, the level of the collective erase verify mode selection signal φaev is made to be "L" to disconnect the common bit line 115 from the even-number bit lines BL0, BL2, . . . , BLm. Further, the level of the pre-charge signal φpre is made to be "L" to turn on the transistor 117 and the transistors 159, thereby individually charging the common bit line 115 and the bit lines BL0 through BLm with the pre-charge voltage Vpre.

Next, the level of the pre-charge signal φpre is made to be "H" to stop the pre-charging of the common bit line 115 and the bit lines BL0 through BLm. Until this stage, all the word lines WL0 through WLn are in the non-selected state.

Next, the level of the collective erase verify mode selection signal φaev is made to be "H" to connect the common bit line 115 to the even-number bit lines BL0, BL2, . . . , BLm and connect the odd-number bit lines BL1, BL3, . . . , BL(m+1) to the Vss line 114. In this case, the level of the collective erase verify mode selection signal φaev# becomes "L", so that all the bit lines BL0 through BL(m+1) are electrically disconnected from the column decoder circuit 113 by the transistors 160. Further, all the word lines WL0 through WLn are selected by the row decoder circuit 112.

Then, if at least one non-erased memory cell exists in the memory cell array 111, the common bit line 115 is discharged via the odd-number bit line BL and the Vss line 114 connected to the source of the corresponding memory cell transistor MT, so that the voltage at the common bit line 115 reduces from the pre-charge voltage Vpre. Consequently, the level of the output signal OUT from the sense amplifier 116 becomes "L".

As described above, in the memory cell array 111 of the virtual ground system semiconductor storage device executing the serial access of the present fifth embodiment, the even-number bit lines BL0, BL2, . . . , BLm are connected to the common bit line 115 via the transistors TN0, TN2, . . . , TNm which are turned on and off by the collective erase verify mode selection signal φaev. On the other hand, the odd-number bit lines BL1, BL3, . . . BL(m+1) are connected to the Vss line 114 via the transistors TN1, TN3, . . . , TN(m+1) which are turned on and off by the collective erase verify mode selection signal φaev. Further, all the bit lines BL0 through BLm between the memory cell array 111 and the column decoder 113 are allowed to be collectively electrically connected and disconnected by the transistors 160 which are turned on and off by the collective erase verify mode selection signal φaev#.

Further, the common bit line 115 is connected to the pre-charge source Vpre via the transistor 117 which is turned on and off by the pre-charge signal φpre, while the bit lines BL0 through BLm are connected to the pre-charge source Vpre via the transistors 159 which are turned on and off by the pre-charge signal φpre.

When executing a verify operation, it is executed according to the following procedure.

(1) The levels of the collective erase verify mode selection signal φaev and the pre-charge signal φpre are made to be "L" to individually charge the common bit line 115 and the bit lines BL0 through BL(m+1) with the pre-charge voltage Vpre.

(2) The level of the pre-charge signal φpre is made to be "H" to stop the charging of the common bit line 115 and the bit lines BL0 through BL(m+1).

(3) The level of the collective erase verify mode selection signal φaev is made to be "H" to connect the even-number bit lines BL0, BL2, . . . , BLm to the common bit line 115 and connect the odd-number bit lines BL1, BL3, . . . , BL(m+1) to the Vss line 114. The level of the collective erase verify mode selection signal φaev# becomes "L" to disconnect all the bit lines BL0 through BL(m+1) from the column decoder circuit 113.

(4) All the word lines WL0 through WLn are selected by the row decoder circuit 112. Then the event that the level of the output signal OUT from the sense amplifier 116 becomes "L" is watched.

Thus, the event that the common bit line 115 has been discharged due to the existence of the non-erased memory cell in the memory cell array 111 is detected.

In this case, the discharge of the common bit line 115 occurs when at least one non-erased memory cell transistor MT exists in the memory cell array 111, and therefore, the verify operation can be accurately collectively executed on the memory cell array 111 of the virtual ground system semiconductor storage device which executes the serial access.

Figure 12:
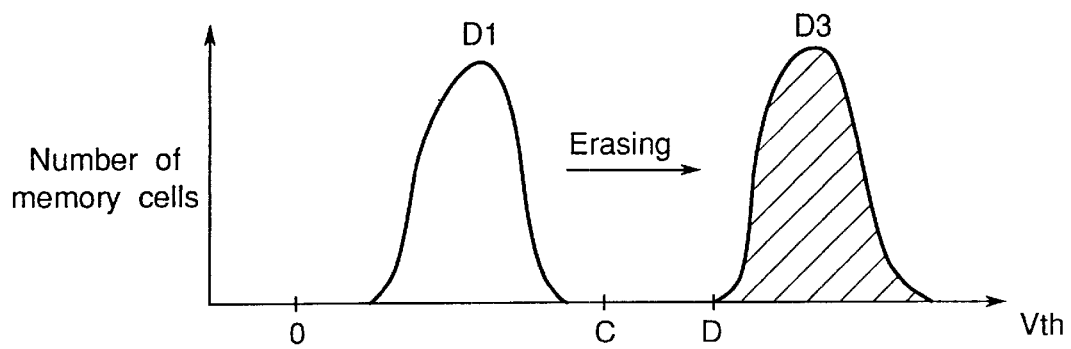
FIG. 12 is a graph showing the change in threshold voltage distribution of the memory cell transistor in the erase operation of the semiconductor storage device of the present invention.
Figure 13:
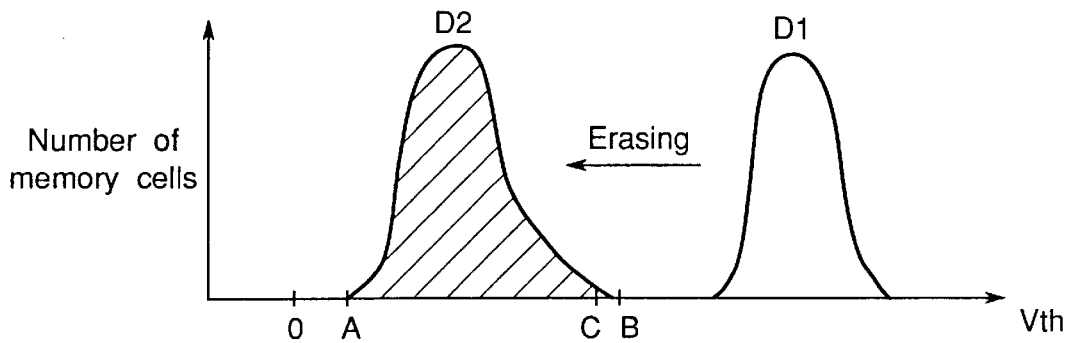
FIG. 13 is a graph showing a change in threshold voltage distribution of memory cell transistors in the erase operation of the prior art semiconductor storage device.

As described above, in each of the aforementioned embodiments, as shown in FIG. 12, the erase operation is executed by increasing the threshold voltage of the memory cell transistor MT from the programmed state D1 to an erased state D3 in which the voltage is higher than the word line selection voltage C in the verify operation. Then, the completion of the verify operation is decided by detecting the event that the memory cell exhibiting the minimum threshold voltage D has been erased. Therefore, the verify operation can be completely collectively executed.

Furthermore, there is no concern about the overerasing.

The aforementioned embodiments have been each described on the basis of the case where the sense amplifiers 8, 38, 58, 95 and 116 are voltage sensing type sense amplifiers and the level of the output signal OUT is changed according to the magnitude relationship between the input voltage from the common bit lines 5, 55 and 115 or the data lines 36 and 94 and the reference voltage Vref. However, the present invention is not limited to this, and each sense amplifiers may be a current sensing type sense amplifier. In such a case, it is proper to change the level of the output signal OUT according to the magnitude relationship between the current flowing through the common bit lines 5, 55 and 115 or the data lines 36 and 94 and a reference current.

Each of the aforementioned embodiments has been based on the postulation that the case where a current has flowed through the memory cell transistor MT is represented by the information "0", the case where no current has flowed is represented by the information "1" and all the memory cells are made to have the information "1" through the erase operation. However, the present invention is also applicable based on the postulation that the case where a current has flowed through the memory cell transistor MT is represented by the information "1", the case where no current has flowed is represented by the information "0" and all the memory cells are made to have the information "0" through the erase operation. In such a case, a difference between the voltage at the common bit lines 5, 55 and 115 or the data lines 36 and 94 and the reference voltage Vref is sensed by the sense amplifiers 8, 38, 58, 95 and 116 or a difference between the current flowing through the common bit lines 5, 55 and 115 or the data lines 36 and 94 and the reference current is sensed by the respective sense amplifiers, and the event that any one of the memory cells is non-erased is similarly detected when the level of the output signal OUT of each. sense amplifier is "L".

The constructions of the column decoder circuits 33 and 93 in the aforementioned embodiments are not limited to the circuit constructions shown in FIGS. 4 and 8. What is essential is the provision of a circuit construction in which the transistors. 41, 101 and 106 for connecting the bit line to the data line or the even-number/odd-number address data line are turned on when the collective erase verify mode selection signal φaev has the active level.

As is apparent from the above, the semiconductor storage device of the present invention executes the erasing of the memory cell array by injecting electrons into the floating gates of all the memory cell transistors. Then, by pre-charging the common bit line with the specified voltage by means of the pre-charging circuit, connecting all the bit lines of the memory cell array to the common bit line by the switching circuit in response to the verify selection signal, selecting all the word lines of the memory cell array by means of the row decoder circuit and watching the detection signal from the sense amplifier, the collective erase verify operation is executed. With this arrangement, the pre-charged common bit line is discharged through the non-erased memory cell transistor when at least one non-erased memory cell exists in the memory cell array.

Therefore, according to the present invention, the erase verify operation can be accurately collectively executed on all the memory cells.

The collective erase verify method of the present invention is implemented, when collectively verifying the event that electrons have been injected into the floating gates of all the memory cell transistors and the held information has been erased in the memory cell array of the semiconductor storage device of the aforementioned invention, by pre-charging the common bit line with the specified voltage, connecting all the bit lines of the memory cell array to the common bit line according to the verify selection signal and selecting all the word lines of the memory cell array, for the execution of the collective erase verify operation based on the detection signal from the sense amplifier. With this arrangement, the pre-charged common bit line is discharged, by which the event that at least one non-erased memory cell exists in the memory cell array can be infallibly detected.

Therefore, according to the present invention, the erase verify operation can be accurately collectively executed on all the memory cells.

The semiconductor storage device of the present invention executes the erasing of the memory cell array by injecting electrons into the floating gates of all the memory cell transistors. Then, the collective erase verify operation is executed by pre-charging the data line with the specified voltage by means of the pre-charging circuit, turning on the switching elements of the column decoder circuit by means of the switching circuit in response to the verify selection signal for the connection of all the bit lines to the data line, selecting all the word lines of the memory cell array by means of the row decoder circuit and observing the detection signal from the sense amplifier. With this arrangement, the pre-charged common bit line is discharged through the non-erased memory cell transistor when at least one non-erased memory cell exists in the memory cell array.

Therefore, according to the present invention, the erase verify operation can be accurately collectively executed on all the memory cells.

The collective erase verify method of the present invention is implemented, when collectively verifying the event that electrons have been injected into the floating gates of all the memory cell transistors and the held information has been erased in the memory cell array of the semiconductor storage device of the aforementioned invention, by pre-charging the data line with the specified voltage, turning on the switching elements of the column decoder circuit according to the verify selection signal for the connection of all the bit lines of the memory cell array to the data line and selecting all the word lines of the memory cell array, for the execution of the collective erase verify operation based on the detection signal from the sense amplifier. With this arrangement, the pre-charged data line is discharged, by which the event that at least one non-erased memory cell exists in the memory cell array can be infallibly detected.

Therefore, according to the present invention, the erase verify operation can be accurately collectively executed on all the memory cells.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
   a memory cell array having nonvolatile memory cells in which control gates and drains of a plurality of memory cell transistors each having a floating gate are connected to word lines and bit lines arranged in a matrix form;
   a row decoder circuit which selects between the word lines of the memory cell array;

a column decoder circuit which selects between the bit lines of the memory cell array;

a sense amplifier which outputs a detection signal upon detecting an event that an inputted voltage or current has exceeded a reference value;

a common bit line connected to an input terminal of the sense amplifier;

a switching circuit which receives a verify selection signal and connects the bit lines of the memory cell array to the common bit line according to the verify selection signal; and a pre-charging circuit which pre-charges the common bit line with a specified voltage.

2. A collective erase verify method for collectively verifying an event that electrons are injected into floating gates of all memory cell transistors to erase information held in a memory cell array of a semiconductor storage device, comprising:

pre-charging a common bit line with a specified voltage;

connecting bit lines of the memory cell array to the common bit line by means of a switching circuit according to a verify selection signal;

selecting all word lines of the memory cell array by means of a row decoder circuit; and executing a collective erase verify operation upon detecting an event that the pre-charged common bit line has been discharged via a non-erased memory cell transistor on the basis of a detection signal from a sense amplifier.

3. A semiconductor storage device comprising:

a memory cell array having nonvolatile memory cells in which control gates and drains of a plurality of memory cell transistors each having a floating gate are connected to word lines and bit lines arranged in a matrix form;

a row decoder circuit which selects between the word lines of the memory cell array according to a row address signal;

a column decoder circuit which selects between the bit lines of the memory cell array according to a column address signal and includes a switching element for connecting the selected bit line to a data line;

a sense amplifier which outputs a detection signal upon detecting an event that the data line is connected to an input terminal of the sense amplifier and a voltage or current inputted from the data line has exceeded a reference value;

a switching circuit which receives a verify selection signal and turns on the switching element according to the verify selection signal regardless of the column address signal, thereby connecting the bit lines of the memory cell array to the data line; and a pre-charging circuit which pre-charges the data line with a specified voltage.

4. A collective erase verify method for collectively verifying an event that electrons are injected into floating gates of all memory cell transistors in a memory cell array of a semiconductor storage device, to erase information held in the memory cell array, said method comprising:

pre-charging a data line with a specified voltage by means of a pre-charging circuit;

turning on switching elements of a column decoder circuit by means of a switching circuit in accordance with a verify selection signal received by the switching circuit, regardless of a column address signal, thereby connecting bit lines of the memory cell array to the data line;

selecting all word lines of the memory cell array by means of a row decoder circuit according to a row address signal; and executing a collective erase verify operation upon detecting an event that the pre-charged data line has been discharged via a non-erased memory cell transistor on the basis of a detection signal from a sense amplifier.

* * * * *